(12) United States Patent
Mitsuhashi

(10) Patent No.: US 7,485,546 B2
(45) Date of Patent: Feb. 3, 2009

(54) METHOD OF MANUFACTURING SEMICONDUCTOR DEVICE

(75) Inventor: Toshiro Mitsuhashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 140 days.

(21) Appl. No.: 11/682,897

(22) Filed: Mar. 7, 2007

(65) Prior Publication Data

US 2007/0231957 A1 Oct. 4, 2007

(30) Foreign Application Priority Data

Mar. 30, 2006 (JP) ............................. 2006-092883

(51) Int. Cl.
*H01L 21/30* (2006.01)
(52) U.S. Cl. .................... 438/459; 438/118; 438/612
(58) Field of Classification Search ............... 438/459, 438/118, 612
See application file for complete search history.

(56) References Cited

U.S. PATENT DOCUMENTS 7,358,602 B2 * 4/2008 Hara ......................... 257/689
2005/0051883 A1 3/2005 Fukazawa \* cited by examiner

*Primary Examiner*—Jack Chen
(74) *Attorney, Agent, or Firm*—Volentine & Whitt, PLLC

(57) ABSTRACT

The present invention provides a method for manufacturing a semiconductor device by which the yield of bumps will be increased. First, an insulation layer, a barrier layer, and a seed layer are sequentially formed on a principal surface of a semiconductor substrate. Then, a protection layer is formed to cover the seed layer and the bumps. Next, portions of the protection layer are removed so that portions of the protection layer covering the sidewalls of the bumps are not removed. Next, the principal surface of the semiconductor substrate is supported by the support through a bonding material, and then a back surface of the semiconductor substrate is polished. Next, the back surface of the semiconductor substrate is polished, and the support and the bonding material are removed.

15 Claims, 6 Drawing Sheets

METHOD OF MANUFACTURING SEMICONDUCTOR DEVICE

CROSS-REFERENCE TO RELATED APPLICATIONS

This application claims priority to Japanese Patent Application No. 2006-092883. The entire disclosure of Japanese Patent Application No. 2006-092883 is hereby incorporated herein by reference.

BACKGROUND OF THE INVENTION

1. Field of the Invention

The present invention generally relates to a method for manufacturing a semiconductor device. More specifically, the present invention relates to a method for manufacturing a semiconductor device in which a plurality of bumps are formed.

2. Background Information

In a conventional method for manufacturing a semiconductor device disclosed in Japan Patent Application Publication JP-A-2005-012024, it is possible to manufacture the semiconductor device by sequentially performing the following steps: forming a portion protruding from the principal surface of a semiconductor substrate, and polishing the back surface thereof.

Although it is possible to manufacture a semiconductor device by performing the above described methods for manufacturing a semiconductor device, there are demands to increase the yield of bumps such as protruding portions.

In view of the above, it will be apparent to those skilled in the art from this disclosure that there exists a need for an improved method for manufacturing a semiconductor device in which bumps are formed. This invention addresses this need in the art as well as other needs, which will become apparent to those skilled in the art from this disclosure.

SUMMARY OF THE INVENTION

According to the present invention, a method of manufacturing a semiconductor device includes the steps of forming an outside layer portion on a first surface of a semiconductor substrate comprising a plurality of semiconductor chips, forming a bump on the outside layer portion, the bump protruding from the outside layer portion and comprising a sidewall, forming a protection layer to cover the outside layer portion and the bump, removing a portion of the protection layer so as to leave a portion of the protection layer covering the sidewall of the bump, applying a bonding material to at least one of the exposed surfaces of the outside layer portion, the bump, and the protection later, attaching a support for supporting the first surface of the semiconductor substrate to the bonding material, polishing a second surface of the semiconductor substrate while the first surface of the semiconductor substrate is supported by the support; and removing the support and the bonding material after polishing the second surface of the semiconductor substrate.

In the manufacturing method of a semiconductor device in accordance with the present invention, the bonding material attached to the protection layer and the support supporting the first surface of the semiconductor substrate are integrally removed along the protection layer formed to cover the sidewalls of the bumps.

According to the present invention, the insulation layer that covers the sidewalls of the bumps is not removed, and then the second surface of the semiconductor substrate is polished, and after this, the bonding material attached to the bumps is separated therefrom. Therefore, it is possible to obtain a method for manufacturing a semiconductor device by which the yield of bumps will be increased.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art this disclosure that the following descriptions of the embodiments of the present invention are provided for illustration only and for the purpose of limiting the invention as defined by the appended claims and their equivalents.

First Embodiment

In reference to FIGS. 1A to 1J, FIG. 2, and FIG. 3, a first embodiment of the present invention will be hereinafter explained in detail.

FIGS. 1A to 1J are cross-sectional diagrams showing the steps of a manufacturing process of a semiconductor device in accordance with the first embodiment of the present invention. FIGS. 1A to 1J show cross-sectional diagrams of a semiconductor device including a semiconductor substrate on which a semiconductor chip 11 is mounted. For example, a silicon substrate with a thickness of approximately 350 μm is used as the semiconductor substrate. Note that an integrated circuit (not shown in the figures), an electrode pad (not shown in the figures), and an interconnection (not shown in the figures) are formed in the semiconductor chip 11. These will be explained below with reference to FIG. 2. Also, note that a through-hole electrode (not shown in the figures) may be formed in the semiconductor substrate. This will be explained below with reference to FIG. 3.

Figure 1A:
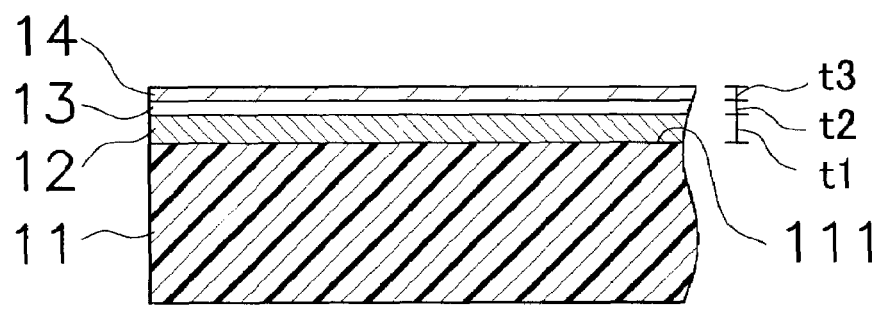
FIG. 1A is a cross-sectional diagram showing a step of a manufacturing process of a semiconductor device in accordance with a first embodiment of the present invention.

First, as shown in FIG. 1A, an insulation layer 12, a barrier layer 13, and a seed layer 14 are sequentially formed on a principal surface (i.e., a first surface) 111 of a semiconductor substrate 11.

In the first embodiment, $SiO_2$ is used as the insulation layer 12. However, other materials such as SiN may be used as the insulation layer 12. In addition, TiN is used as the barrier layer 13. However, other materials such as TiW may be used as the barrier layer 13. Furthermore, Cu is used as the seed layer 14. However, other materials such as W may be used as the seed layer 14.

In the present embodiment, as shown in FIG. 1A, the insulation layer 12 is firstly formed on the principal surface 111 of the semiconductor substrate 11 by means of the CVD (chemical vapor deposition) method. Here, the insulation layer 12 has a thickness of approximately 1 μm (i.e., thickness t1), for instance. Next, the barrier layer 13 and the seed layer 14 are formed on the insulation layer 12 by means of sputtering. Here, the barrier layer 13 has a thickness of approximately 0.2 μm (i.e., thickness t2), for instance. On the other hand, the seed layer 14 has a thickness of approximately 0.2 μm (thickness t3). In the first embodiment, the barrier layer 13 and the seed layer 14 of the above described three layers 12 to 14 are collectively called "an outside-layer portion." Note that if only the barrier layer 13 is formed on the insulation layer 12, the barrier layer 13 is also called the outside-layer portion.

Figure 1B:
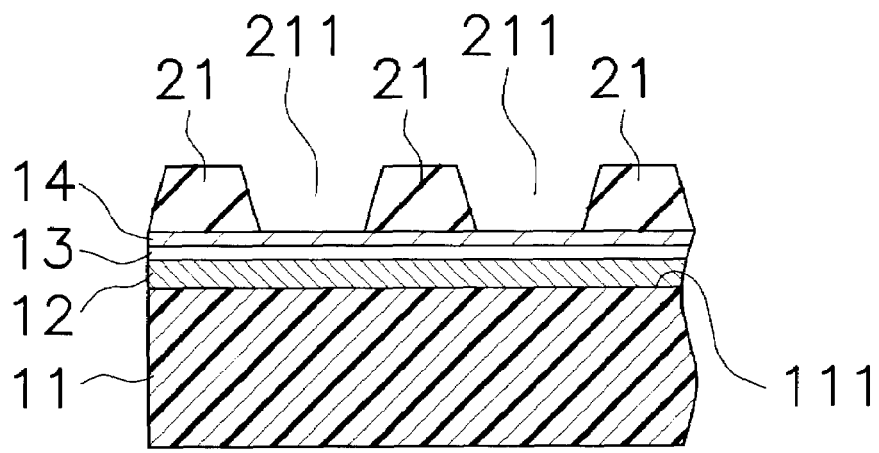
FIG. 1B is a cross-sectional diagram showing a step of the manufacturing process of the semiconductor device in accordance with the first embodiment of the present invention.

Next, as shown in FIG. 1B, a resist layer 21 is formed by means of photolithography. Note that the resist 21 is used when bumps 22 are formed in a following step (see FIG. 1C). Here, the resist layer 21 is formed to have openings 211 in which the bumps 22 are formed in a following step.

Figure 1C:
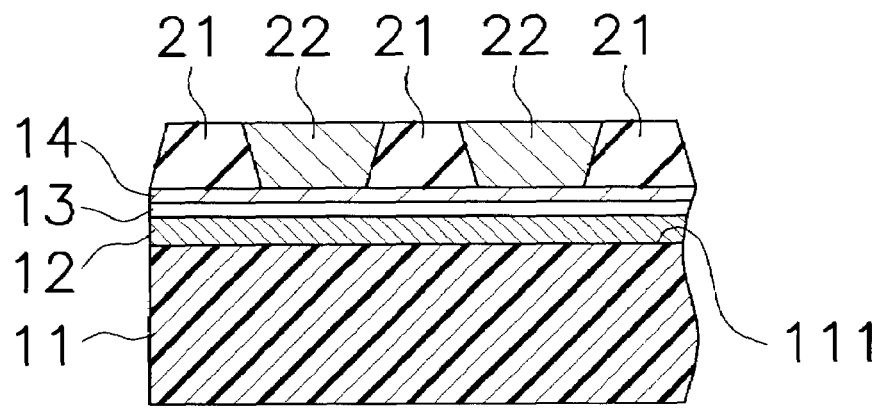
FIG. 1C is a cross-sectional diagram showing a step of the manufacturing process of the semiconductor device in accordance with the first embodiment of the present invention.

Next, as shown in FIG. 1C, the bumps 22 are formed in the openings 211 with use of the resist layer 21 as a mask. Specifically, SnAg is filled in the openings 211, and the bumps 22 are formed by means of electrolytic plating of SnAg. In the first embodiment, SnAg is used as a material for the bumps 22. However, other materials such as Ag or Cu may be used as the material for the bumps 22.

Figure 1D:
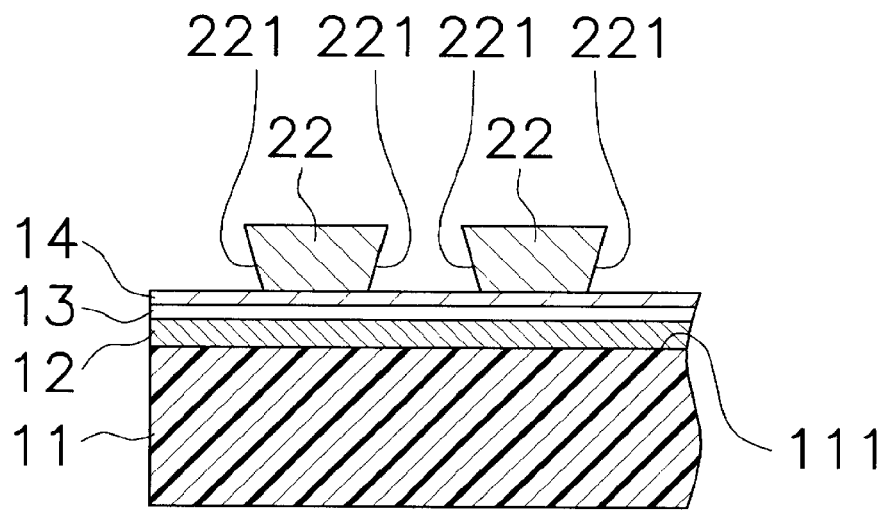
FIG. 1D is a cross-sectional diagram showing a step of the manufacturing process of the semiconductor device in accordance with the first embodiment of the present invention.

Next, as shown in FIG. 1D, the mask of the resist layer 21 is removed, and thus the sidewalls 221 of the bumps 22 protruding from the seed layer 14 are exposed. Here, the bumps 22 are formed in a cylindrical shape, and the sidewalls 221 of the bumps 22 tend to be formed in a reverse taper shape. The shape of the bumps 22 is not limited to a specific shape as long as the bumps 22 are formed in a protruding shape (i.e., a convex shape).

Figure 1E:
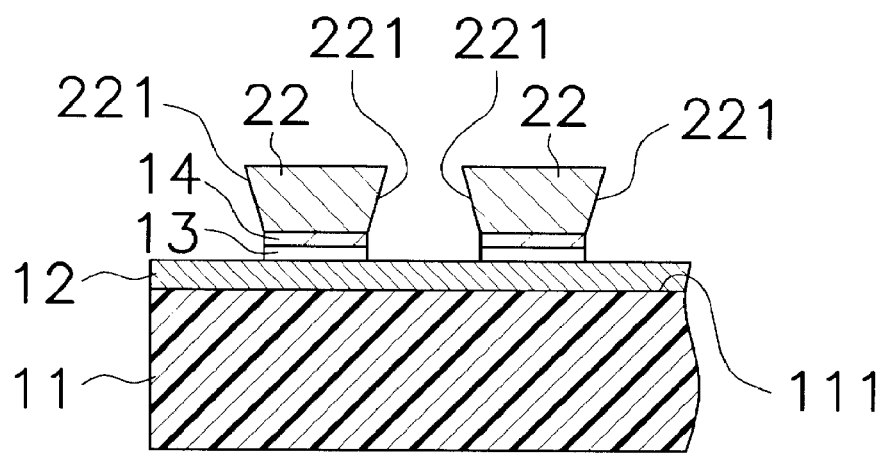
FIG. 1E is a cross-sectional diagram showing a step of the manufacturing process of the semiconductor device in accordance with the first embodiment of the present invention.

Next, as shown in FIG. 1E, the barrier layer 13 and the seed layer 14 are removed by means of wet etching. Etching solution such as potassium hydroxide (KOH) solution is used for the wet etching. Here, portions of the seed layer 14 and the barrier layer 13, which are formed immediately below the bumps 22, are left unetched. On the other hand, the other portions of the seed layer 14 and the barrier layer 13 are removed at this time.

Figure 1F:
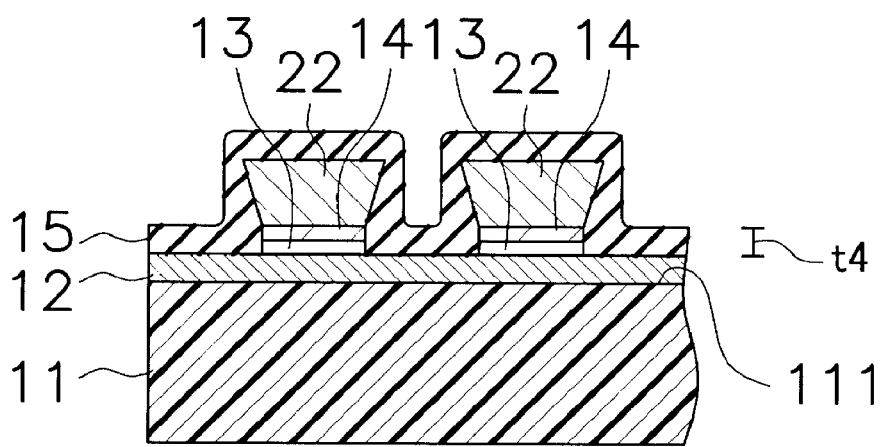
FIG. 1F is a cross-sectional diagram showing a step of the manufacturing process of the semiconductor device in accordance with the first embodiment of the present invention.

Next, as shown in FIG. 1F, a protection layer 15 is formed to cover the insulation layer 12, the barrier layer 13, and the seed layer 14 by means of the CVD method. In the first embodiment, SiN is used as the protection layer 15. However, other materials such as $SiO_2$ may be used as the protection layer 15. In addition, the protection layer 15 is formed to have a thickness of approximately 2 μm (i.e., thickness t4), for instance.

The protection layer 15 is formed to prevent the sidewalls of the bumps 22 from being formed in a taper shape (including steps) as shown in the sidewalls 221 that tend to be formed in a reverse taper shape. In this respect, it is preferable for the thickness t4 of the protection layer 15 to be formed to be larger than sum (i.e., the thickness of the outside-layer portion) of the thickness t2 (e.g., 0.2 μm) of the barrier layer 13 and the thickness t3 (e.g., 0.4 μm) of the seed layer 14.

In other words, in FIG. 1F, it is preferable for the protection layer 15 to be formed so that the sidewalls 221 of the bumps 22 are formed in a taper shape with positive gradient.

Figure 1G:
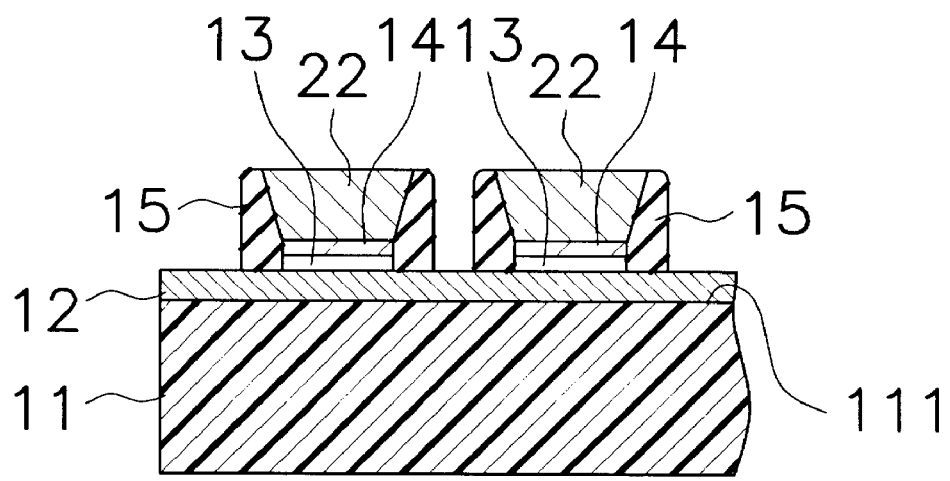
FIG. 1G is a cross-sectional diagram showing a step of the manufacturing process of the semiconductor device in accordance with the first embodiment of the present invention.

Next, as shown in FIG. 1G, portions of the protection layer 15 are removed by means of dry etching, and thus portions of the protection layer 15 that cover the sidewalls 221 of the bumps 22 are left unetched. Here, an etching gas such as sulphur tetrafluoride (SF4) is used for the dry etching. Then, in the dry etching, the entire surface of the protection layer 15 is etched back, and portions of the protection layer 15 formed on the upper surface of the insulation layer 12 and the bumps 22 are removed.

Furthermore, in a step shown in FIG. 1G, a parallel-plate electrode reactive etching device is used as an etching device, for instance. Here, the etching condition is set as follows. Here, the etching gas includes Ar, $CHF_3$, $CF_4$, and $O_2$. The gas flow rates of Ar, $CHF_3$, $CF_4$, and $O_2$ are set to be 1000, 30, 50, and 30 sccm, respectively. In addition, the chamber pressure is set to be 1 Torr, and the RF power is set to be 1400 W. Note that the etching period is set to be 3 minutes when SiN of 2 μm is etched back.

Figure 1H:
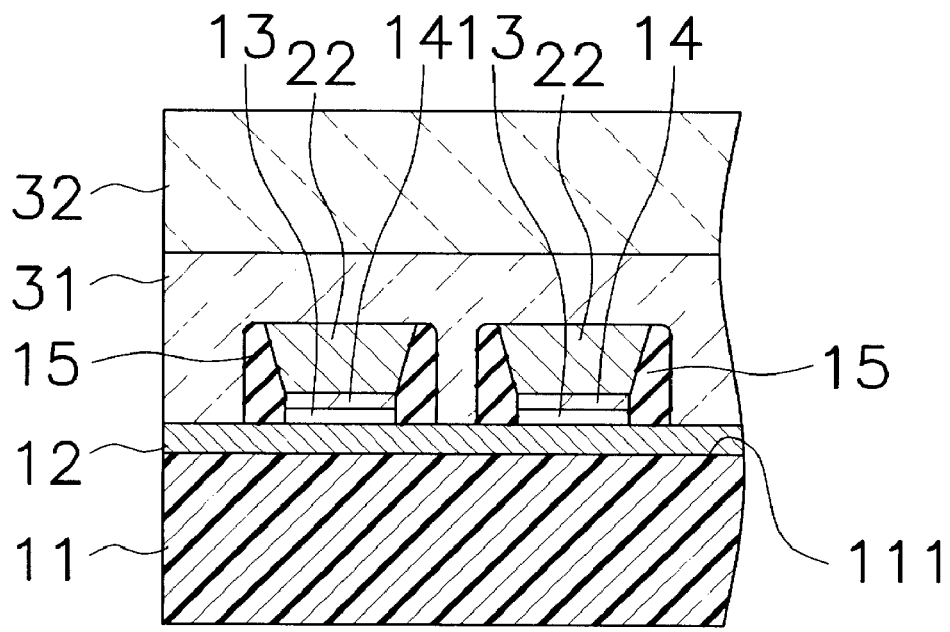
FIG. 1H is a cross-sectional diagram showing a step of the manufacturing process of the semiconductor device in accordance with the first embodiment of the present invention.

Next, as shown in FIG. 1H, pressure is applied to the principal surface 111 of the semiconductor substrate 11 through a bonding material 31 by pressing a support 32 from above the bumps 22. In the first embodiment, adhesive such as UV adhesive is used as the bonding material 31. In addition, a material such as glass material and plastic material is used as the support 32. Here, the support 32 is used for supporting the principal surface 111 of the semiconductor substrate 11. Therefore, it is preferable to select a type of the support 32 whose surface facing the principal surface 111 of the semiconductor substrate 11 is formed to be flat.

Here, the bonding material 31 is attached to the exposed surfaces of the insulation layer 12, the protection layer 15, and the bumps 22. Then, the support 32 is attached/bonded to the principal surface 111 of the semiconductor substrate 11 through the bonding material 31 and the insulation layer 12.

Figure 1I:
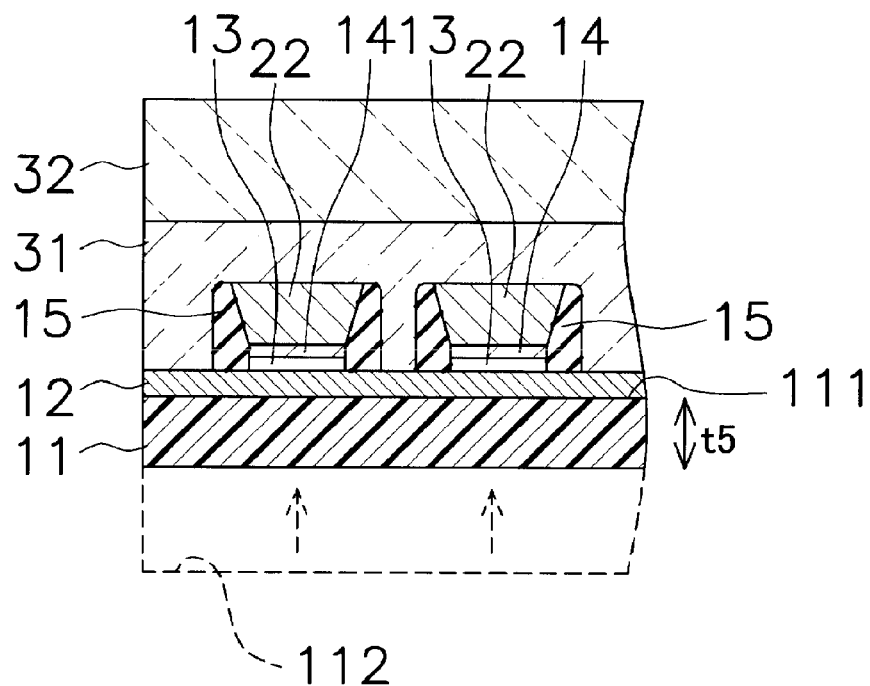
FIG. 1I is a cross-sectional diagram showing a step of the manufacturing process of the semiconductor device in accordance with the first embodiment of the present invention.

Next, as shown in FIG. 1I, a back surface 112 of the semiconductor substrate 11 supported by the support 32 is polished so that the thickness of the semiconductor substrate 11 is reduced to be a predetermined thickness t5 (e.g., 50 μm). For example, either mechanical polishing or chemical polishing may be used as the polishing method. Alternatively, a combination of these methods may be used in the polishing.

Figure 1J:
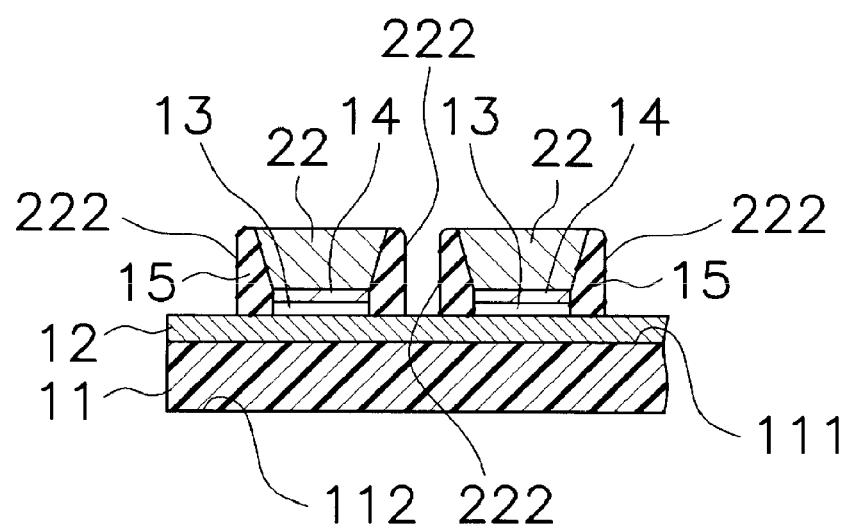
FIG. 1J is a cross-sectional diagram showing a step of the manufacturing process of the semiconductor device in accordance with the first embodiment of the present invention.

Then, as shown in FIG. 1J, the support 32 and the bonding material 31 are removed after the above described polishing is performed. Here, the protection layer 15 is formed on the sidewalls 221 of the bumps 22 (see FIG. 1E). Therefore, sidewalls 222 are formed in a positive-gradient taper shape without any step, while the sidewalls 221 of the bumps 22 shown in FIG. 1E are formed in a reverse taper shape. Therefore, the support 32 and the bonding material 31 are integrally removed along the sidewalls 222 formed in a taper shape with positive gradient. Therefore, the frequency of occurrence of the following problems will be reduced: after the removal step is performed, the bonding material 31 will remain attached or the bumps 22 are removed due to the shape of the sidewalls 222. Therefore, the yield of the bumps 22 will be increased.

Figure 2:
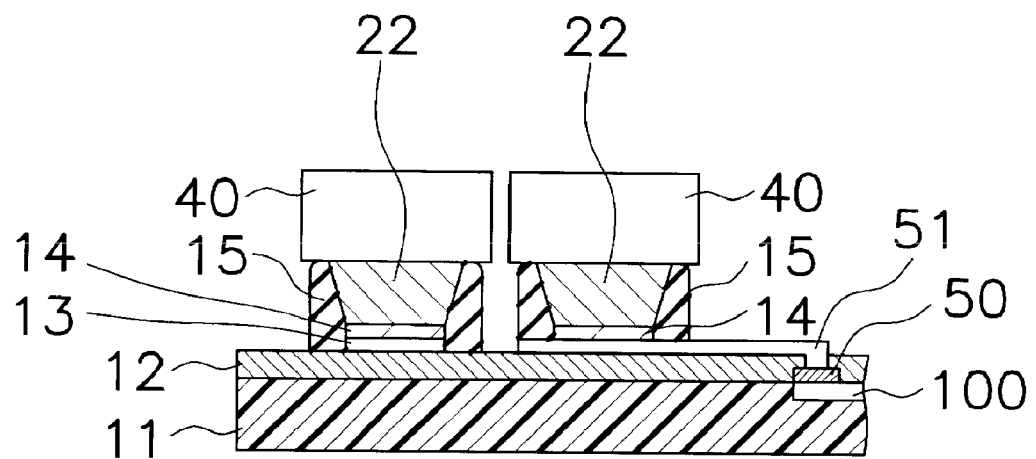
FIG. 2 is a cross-sectional diagram showing a configuration of a semiconductor device in which a plurality of external terminals are formed to overlie bumps.

Then, external terminals 40 are formed on the bumps 22, and thus a semiconductor device is completed. FIG. 2 is an example of the configuration of the semiconductor device.

In the semiconductor device shown in FIG. 2, the external terminals 40 are connected to the upper side of the bumps 22. In addition, an integrated circuit (IC) 100 is formed in a semiconductor chip (i.e., a portion of the semiconductor substrate 11). Furthermore, an electrode pad 50 formed on the surface of the integrated circuit 100 is mechanically and electrically connected to the bumps 22 through an interconnection 51. For example, a circuit such as a memory may be used as the integrated circuit 100. In addition, a metal pad such as aluminum may be used as the electrode pad 50. The electrode pad 50, the interconnection 51, and the integrated circuit 100 are preliminarily built into the semiconductor chip 11. Therefore, when the resist layer 21 is formed in the step shown in FIG. 1B, the arrangement of the resist layer 21 will be determined in consideration of factors such as the arrangement of the electrode pad 50, the interconnection 51, and the integrated circuit 100. With this configuration, it is also possible to produce a semiconductor device in which external terminals 40 are disposed on the bumps 22.

Modification of First Embodiment

Figure 3:
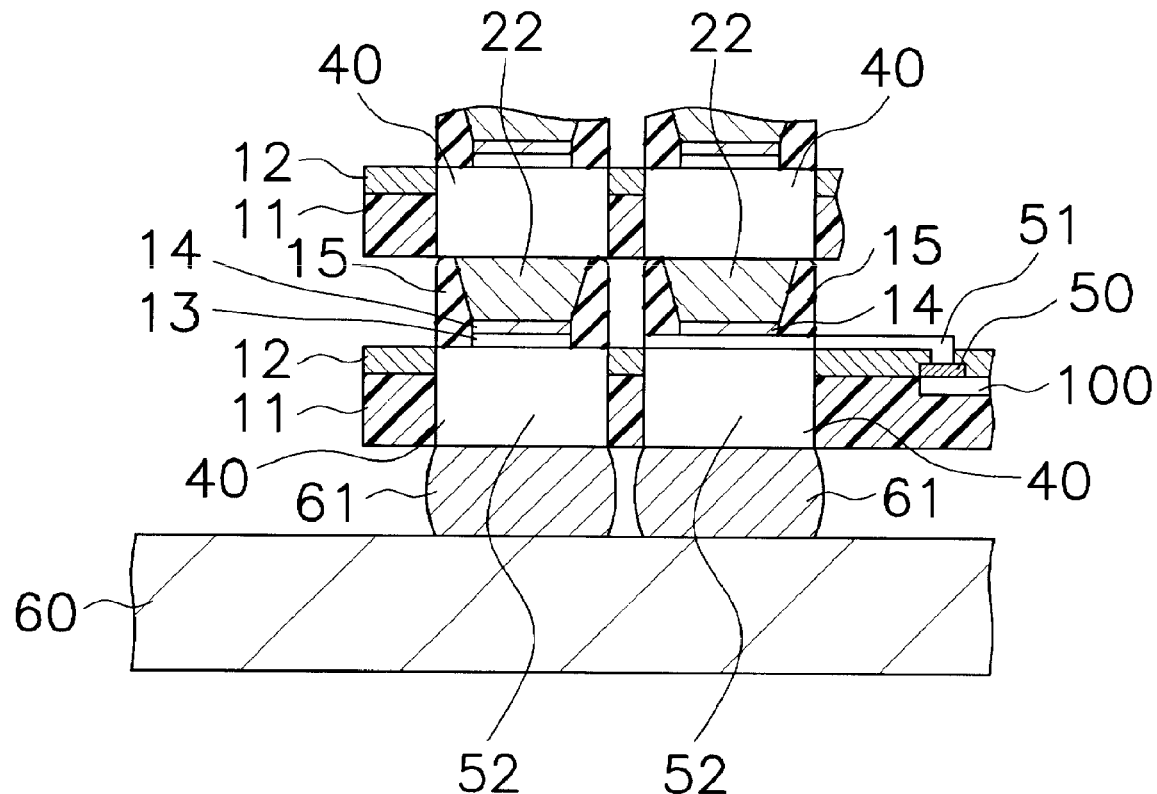
FIG. 3 is a cross-sectional diagram showing a configuration of a semiconductor device in which a plurality of semiconductor chips 11 including through-hole electrodes and bumps are laminated.

FIG. 3 shows an example of a semiconductor device in which semiconductor chips 11 including bumps 22 formed by the manufacturing step shown in FIG. 1J are laminated instead of disposing the external terminals 40 on the bumps 22 shown in FIG. 2. Note that each of the semiconductor chips 11 shown in FIG. 3 is different from the semiconductor chip 11 shown in FIG. 2 in that through-hole electrodes 52 are formed in addition to the electrode pad 50 and the interconnection 51 as shown in FIG. 3. The through-hole electrodes 52 penetrate the semiconductor chip 11 through both sides (i.e., the principal surface and the back surface of the semiconductor chip 11). The through-hole electrodes 52 are formed by means of a metal plating method, and they are also preliminarily built into the semiconductor chip 11 shown in FIG. 1A.

The semiconductor device shown in FIG. 3 includes two semiconductor chips 11. Here, the semiconductor chips 11 are arranged to face each other. A lowest-layer semiconductor chip 11 (corresponding to a lower-layer semiconductor chip 11 shown in FIG. 3) is connected to through-hole electrodes 52 formed in a semiconductor chip 11 disposed above the lowest-layer semiconductor chip 11 (corresponding to an upper-layer semiconductor chip 11 shown in FIG. 3) through the bumps 22 disposed above the lowest-layer semiconductor chip 11 (corresponding to the lower-layer semiconductor chip 11 shown in FIG. 3). Because of this, the conduction paths of the two semiconductor chips 11 are secured. With this configuration, it is also possible to produce a semiconductor device in which a plurality of semiconductor chips 11 are laminated.

Furthermore, bumps 61 are formed under the lowest-layer semiconductor chip 11, and the bumps 61 are disposed on the circuit board 60. For example, the bumps 61 are made of Cu. In addition, an organic board such as a glass epoxy board is used as the circuit board 60, for instance. A predetermined circuit is formed on the circuit board 60. For example, a motherboard is used as the circuit board 60. With this configuration, it is also possible to produce a circuit board 60 on which a plurality of semiconductor chips 11 are mounted.

Note that only portions of the two semiconductor chips 11 are shown in FIG. 3, but three or more semiconductor chips 11 may be laminated.

Second Embodiment

Figure 4A:
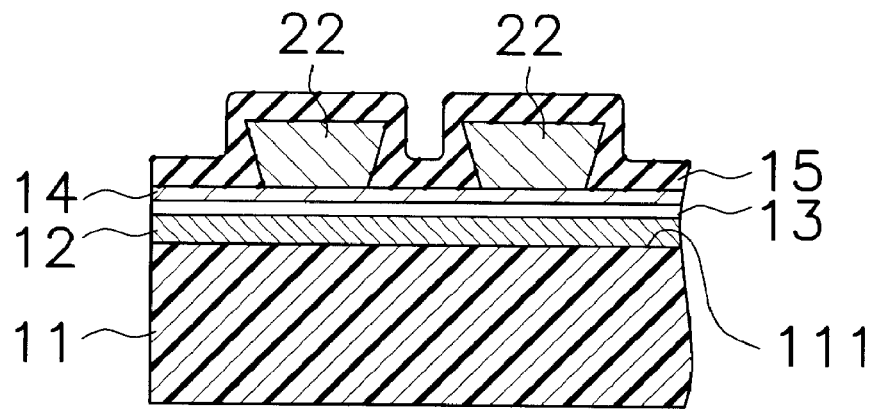
FIG. 4A is a cross-sectional diagram showing a step of a manufacturing process of a semiconductor device in accordance with a second embodiment of the present invention.
Figure 4B:
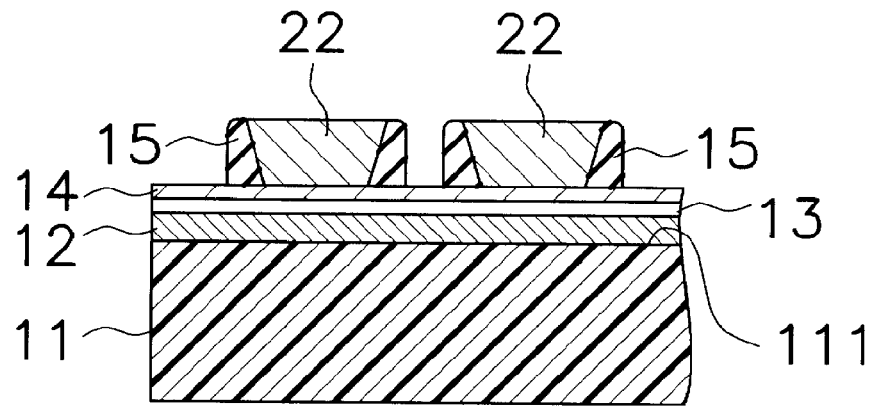
FIG. 4B is a cross-sectional diagram showing a step of the manufacturing process of the semiconductor device in accordance with the second embodiment of the present invention.
Figure 4C:
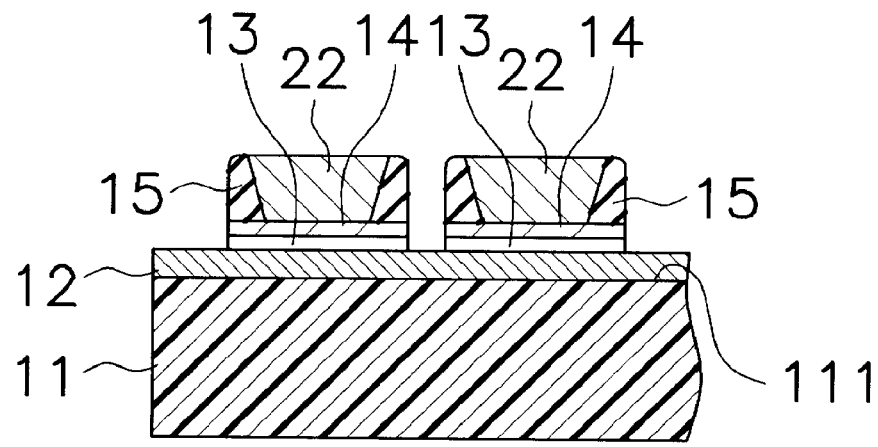
FIG. 4C is a cross-sectional diagram showing a step of the manufacturing process of the semiconductor device in accordance with the second embodiment of the present invention.

With reference to FIGS. 4A to 4C, the second embodiment of the present invention will be hereinafter explained in detail. Note that the same numerals, symbols, and terms are given to the portions that are the same as those in the semiconductor device in accordance with the first embodiment of the present invention, and those explanations will be hereinafter omitted for convenience.

The method for manufacturing a semiconductor device of the second embodiment is different from that of the first embodiment shown in FIGS. 1A to 1J in the timing of removing portions of the barrier layer 13 and the seed layer 14. More specifically, in the first embodiment of the present invention, the step of removing the portions of the barrier layer 13 and the seed layer 14 (see FIG. 1E) is performed before the step of forming the protection layer 15 (see FIG. 1F). On the other hand, in the second embodiment of the present invention, a step of removing the portions of the barrier layer 13 and the seed layer 14 is performed after a step of forming a protection layer 15. In other words, in the first embodiment of the present invention, the manufacturing steps shown in FIGS. 1E, 1F, and 1G are sequentially performed in this order. However, in the second embodiment of the present invention, these steps are sequentially performed in the order of the manufacturing steps shown in FIGS. 1F, 1G, and 1E. With reference to FIGS. 4A to 4C, manufacturing steps corresponding to those performed in the order of the steps shown in FIGS. 1F, 1G, and 1E are hereinafter mainly explained.

FIGS. 4A to 4C are cross-sectional diagrams showing some steps of the manufacturing process of a semiconductor device in accordance with the second embodiment of the present invention.

As shown in FIG. 4A (corresponding to FIG. 1F), after the manufacturing step shown in FIG. 1D is performed, a protection layer 15 is formed to cover the seed layer 14 and the bumps 22 by means of the CVD method.

Next, as shown in FIG. 4B (corresponding to FIG. 1G), the entire surface of the protection layer 15 is etched back by means of dry etching. Thus, portions of the protection layer 15 that covers the seed layer 14 and the bumps 22 are removed. At the same time as this, portions of the protection layer 15 that cover the sidewalls 221 of the bumps 22 are left unetched. Here, the surface of the seed layer 14 is etched by the dry etching. However, the surface of the insulation layer 12 is prevented from being etched because the seed layer 14 and the barrier layer 13 are formed on the insulation layer 12. These steps are different from those of the first embodiment (see FIG. 1G) in which dry etching is performed while the surface of the insulation layer 12 is exposed.

Therefore, compared to the dry etching performed in the first embodiment, that performed in the second embodiment is more useful because it is possible to avoid drawback that the insulation layer 12 is etched by the dry etching. In addition, the surface of the insulation layer 12 is protected by the seed layer 14 in the dry etching. Therefore, the effect of side-etch on the insulation layer 12 will be less in the subsequent steps. Therefore, it is possible to inhibit the generation of void even when performing reflow.

Note that the present invention is not limited to the above described embodiments, and various modifications and changes are possible. For example, a semiconductor substrate made of a material such as gallium arsenic (GaAs) or InP may be used as the semiconductor substrate.

GENERAL INTERPRETATION OF TERMS

In understanding the scope of the present invention, the term "configured" as used herein to describe a component, section or part of a device includes hardware and/or software that is constructed and/or programmed to carry out the desired function. In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applied to words having similar meanings such as the terms, "including," "having," and their derivatives. Also, the term "part," "section," "portion," "member," or "element" when used in the singular can have the dual meaning of a single part or a plurality of parts. Finally, terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A method of manufacturing a semiconductor device, comprising the steps of:
    forming an outside layer portion on a first surface of a semiconductor substrate comprising a plurality of semiconductor chips;
    forming a bump on the outside layer portion, the bump protruding from the outside layer portion and comprising a sidewall;
    forming a protection layer to cover the outside layer portion and the bump;
    removing a portion of the protection layer so as to leave a portion of the protection layer covering the sidewall of the bump;
    applying a bonding material to at least one of exposed surfaces of the outside layer portion, the bump, and the protection layer;
    attaching a support for supporting the first surface of the semiconductor substrate to the bonding material;
    polishing a second surface of the semiconductor substrate while the first surface of the semiconductor substrate is supported by the support; and
    removing the support and the bonding material after polishing the second surface of the semiconductor substrate.

2. The method of manufacturing a semiconductor device according to claim 1, wherein the thickness of the protection layer covering the outside layer portion and the bumps is formed to be greater than the thickness of the outside layer portion.

3. The method of manufacturing a semiconductor device according to claim 1, wherein the protection layer is formed so that the sidewall of the bump is formed to be in a taper shape when the sidewall of the bump is formed in a reverse taper shape.

4. The method of manufacturing a semiconductor device according to claim 1, further comprising the step of:
    removing the outside layer portion before the step of removing the portion of the protection layer and after the step of forming the protection layer.

5. The method of manufacturing a semiconductor device according to claim 2, further comprising the step of:
    removing the outside layer portion before the step of removing the portion of the protection layer and after the step of forming the protection layer.

6. The method of manufacturing a semiconductor device according to claim 3, further comprising the step of:
    removing the outside layer portion before the step of removing the portion of the protection layer and after the step of forming the protection layer.

7. The method of manufacturing a semiconductor device according to claim 1, further comprising the step of:
    removing the outside layer portion before the step of joining the support and after the step of removing the portion of the protection layer.

8. The method of manufacturing a semiconductor device according to claim 2, further comprising the step of:
    removing the outside layer portion before the step of joining the support and after the step of removing the portion of the protection layer.

9. The method of manufacturing a semiconductor device according to claim 3, further comprising the step of:
    removing the outside layer portion before the step of joining the support and after the step of removing the portion of the protection layer.

10. The method of manufacturing a semiconductor device according to claim 1, further comprising the step of:
    forming an external terminal on the bump after the step of removing the bonding material.

11. The method of manufacturing a semiconductor device according to claim 2, further comprising the step of:
    forming an external terminal on the bump after the step of removing the bonding material.

12. The method of manufacturing a semiconductor device according to claim 3, further comprising the step of:
    forming an external terminal on the bump after the step of removing the bonding material.

13. The method of manufacturing a semiconductor device according to claim 1, further comprising the step of:

laminating the semiconductor chips formed in the semiconductor substrate through the bump after the step of the removing the bonding material when a though-hole electrode is formed to penetrate the semiconductor substrate through the first and second surfaces.

14. The method of manufacturing a semiconductor device according to claim 2, further comprising the step of:

laminating the semiconductor chips formed in the semiconductor substrate through the bump after the step of the removing the bonding material when a though-hole electrode is formed to penetrate the semiconductor substrate through the first and second surfaces.

15. The method of manufacturing a semiconductor device according to claim 3, further comprising the step of:

laminating the semiconductor chips formed in the semiconductor substrate through the bump after the step of the removing the bonding material when a though-hole electrode is formed to penetrate the semiconductor substrate through the first and second surfaces.

* * * * *